United States Patent [19]

Dagostino

[11] 4,198,683
[45] Apr. 15, 1980

[54] MULTIPLE WAVEFORM STORAGE SYSTEM

[75] Inventor: Thomas P. Dagostino, Portland, Oreg.

[73] Assignee: Tektronix, Inc., Beaverton, Oreg.

[21] Appl. No.: 901,903

[22] Filed: May 1, 1978

[51] Int. Cl.² .............................................. G06F 3/05
[52] U.S. Cl. ..................................................... 364/900
[58] Field of Search ... 364/200 MS File, 900 MS File

[56] References Cited

U.S. PATENT DOCUMENTS

| | | |
|---|---|---|
| 3,387,282 | 6/1968 | Jacques .................................... 364/900 |
| 3,406,387 | 10/1968 | Werme ................................. 364/900 X |
| 3,835,455 | 9/1974 | Abbenante ............................. 364/900 |
| 4,019,040 | 4/1977 | Thompson ............................. 364/900 |

Primary Examiner—Harvey E. Springborn
Attorney, Agent, or Firm—George T. Noe

[57] ABSTRACT

A system for storing waveforms in which each waveform is converted to digital data and stored in a memory sector under the control of a history controller to select the sector and memory counter to select the individual address locations in each sector. When the memory capacity is exceeded, the oldest waveform data is replaced by the newest.

4 Claims, 1 Drawing Figure

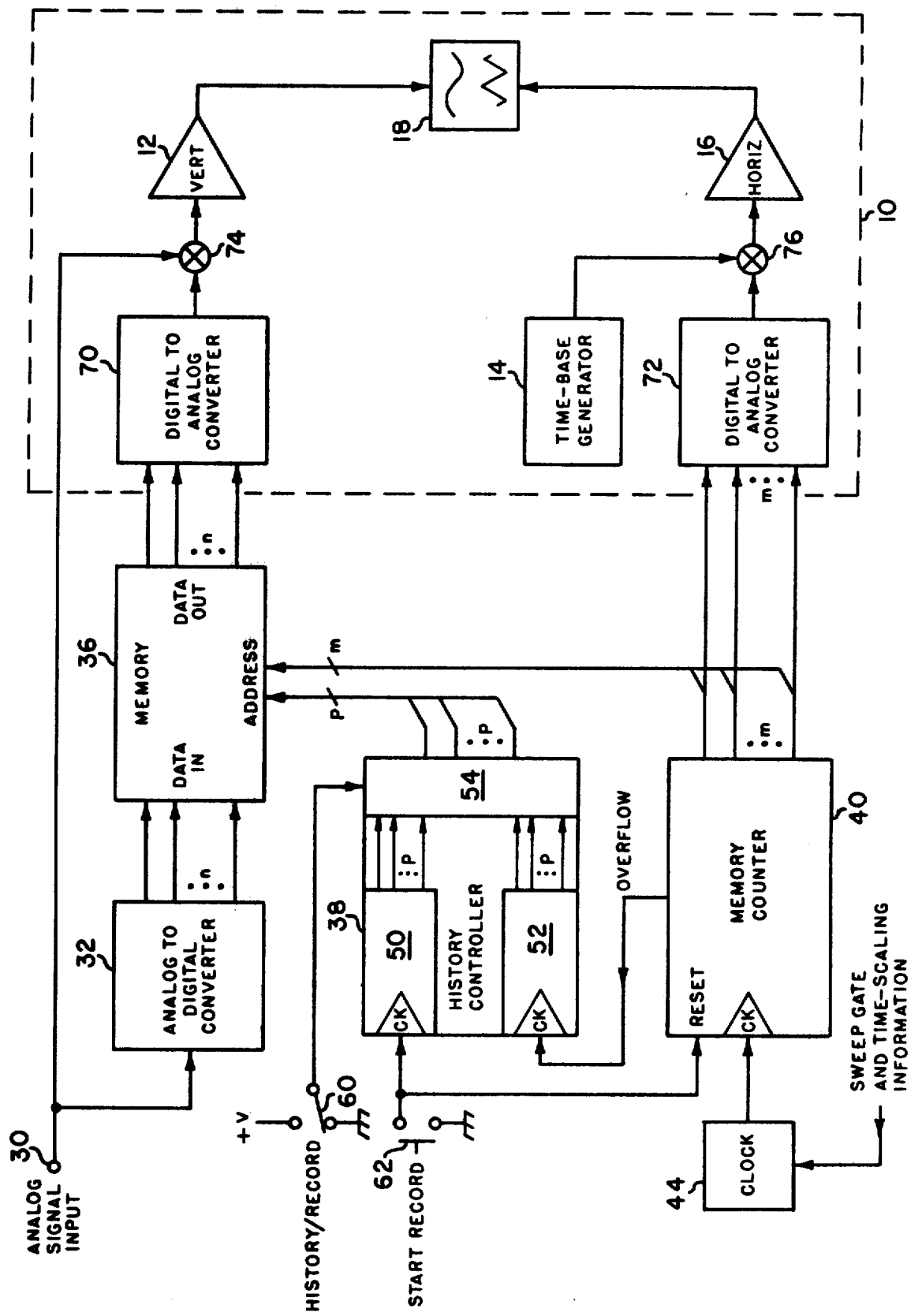

MULTIPLE WAVEFORM STORAGE SYSTEM

BACKGROUND OF THE INVENTION

Some modern display devices such as oscilloscopes employ built-in waveform memories wherein electrical analog signals may be quantized and converted to digital bits, and such signals then may be stored for subsequent processing or display. One application for such a display device is in the study of a history of waveforms or chronological events. For example, a series of waveforms may be stored and displayed so that the effects on signals of circuit adjustments may be viewed, or changes in speech or physiological signal patterns may be viewed, or comparisons may be made on a series of events.

Heretofore, display devices having multiple waveform storage capability have been cumbersome to operate, and are prone to error. The problems stem from the fact that the stored waveforms must be stored and recalled individually by use of switches associated with each predesignated memory sector. Further, under most presently available systems only one waveform at a time may be viewed.

SUMMARY OF THE INVENTION

In accordance with the present invention, a multiple waveform storage system is provided in which each waveform is converted to digital data and stored into memory locations under the control of a combination of a history controller and a memory counter. The history controller selects a memory sector for each waveform, and the memory counter selects the individual address locations in each sector. The history controller keeps track of the last-stored sector, and upon command sequences to the next sector to store another waveform. When all of the memory sectors contain stored waveforms, the history controller returns to the first sector in the sequence and the oldest stored waveform data is replaced by new waveform data. A history mode may be selected in which the history controller and memory counter cyclically sequence through all of the memory sectors to permit display of all of the stored waveforms.

It is therefore one object of the present invention to provide a novel system for storing a plurality of waveforms.

It is another object to provide a multiple waveform storage system wherein the oldest data is replaced by the newest data.

It is a further object to provide a multiple waveform storage system wherein memory sectors are sequentially addressed automatically.

It is an additional object to provide a waveform history system wherein waveforms are automatically stored and displayed in chronological order.

Further objects, features, and advantages will be apparent from consideration of the following description taken in conjunction with the accompanying drawing.

DRAWING

The single FIGURE is a detailed block diagram of a multiple waveform storage system in accordance with the present invention.

DETAILED DESCRIPTION OF THE DRAWING

In a preferred embodiment, a display device 10 suitably may be a conventional cathode-ray oscilloscope modified to accept digital input signals as well as analog input signals. The conventional components of the oscilloscope include a vertical amplifier 12, a time-base generator 14, a horizontal amplifier 16, and a cathode-ray tube having a display screen 18 upon which an electron beam is traced under control of vertical and horizontal deflection plates to which the respective vertical and horizontal amplifier output signals are connected.

Analog electrical signals are applied to the system via an input terminal 30. The analog signal is converted to n-bit parallel digital data by a conventional analog-to-digital converter 32. This analog-to-digital converter suitably may be of the type that is clocked or strobed to provide the digital data at a predetermined conversion rate. In the present embodiment, it would be desirable to employ several conversion rates which correspond to the several time-base sweep rates to facilitate time-scaling of the waveform data. Such time-scaling information may be supplied from the sweep rate selector portion of the time-base generator.

A memory 36 is provided for storing a plurality of waveforms. The memory is partitioned into $2^p$ sectors, each sector having $2^m$ address locations and each address location having n storage cells. Thus the memory size is at least $n2^{(m+p)}$, or 10,240 where $p=1$, $m=9$, and $n=10$. The memory addresses are selected by the combination of a history controller 38 and a memory counter 40 wherein the history controller selects a memory sector for each waveform, and the memory counter selects the address locations in each sector where the n bits of data are stored. The memory counter 40, which may suitably be a resettable binary counter, operates in response to a clock signal from a clock 44, producing a count sequence to scan the address locations.

The history controller 38 suitably may include two binary counters 50 and 52 and a multiplexer 54. A double pole double throw switch 60 is connected to the multiplexer so that an operator may select from a front panel either a history or a record mode of operation. A momentary-contact switch 62 is connected to the clock input of counter 50, and also is connected to the reset input of memory counter 40. The overflow output from memory counter 40 is connected to the clock input of counter 52.

The parallel data output lines from memory 36 are connected to a digital-to-analog converter 70 within the display device 10. The count output lines from memory 40 are additionally connected to a digital-to-analog converter 72. A pair of switches 74 and 76, which may be field-effect transistors, for example, are included in the display device 10 to permit a display selection from either real-time or stored waveforms, or a multiplexed display of both real-time and stored waveforms is permissible. Real-time waveforms are produced by applying the analog input signal directly from input terminal 30 to the vertical deflection amplifier via switch 74 and a time-base sawtooth waveform from time-base generator 14 to the horizontal deflection amplifier 16 via switch 76.

Typical operation of the multiple waveform storage system is as follows: In the record mode, switch 60 is placed in the RECORD position, conditioning multiplexer 54 to pass only the count information from counter 50 within the history controller 38. While viewing the real-time waveform on the display screen 18, the time base generator trigger level and timing controls are adjusted to provide the desired waveform display. In the RECORD mode, the clock 44 is disabled when the actual waveform storage process is not taking place, and it is convenient to utilize a single sweep gate from the time-base generator 14 to provide a disable-enable control of the clock 44. The momentary pushbutton switch 62, START RECORD, is pressed to initialize the system by resetting the memory counter 40 to zero and advancing counter 50 one count to select the first waveform sector in memory 36. When the analog input signal reaches the triggering point established by the time-base triggering controls, the clock 44 is enabled by the sweep gate and the memory counter 40 begins its count, sequentially addressing storage locations in the sector selected by the history controller 38. As the storage locations are addressed, the waveform data from analog-to-digital converter 32 is stored in memory 36. When the sweep gate terminates, the clock 44 is disabled, and the waveform storage of the first sector is complete. To store a second waveform, switch 62, START RECORD, is again pressed, resetting memory counter 40 to zero and advancing counter 50 one count to select the second waveform sector in memory 36. The second waveform will be stored into memory 36 upon triggering of the time-base generator 14 as before. After the memory capacity is full, that is, after all of the sectors in memory 36 contain stored waveforms, the next waveform will be stored in the first sector since counter 50 will start its count cycle over on the next count. Thus, the oldest stored data is replaced by the newest waveform data.

In the history mode of operation, switch 60 is placed in the HISTORY position, conditioning multiplexer 54 to pass only the count output from counter 52, which advances one count each time the memory counter 40 completes its count and overflows. In this mode, clock 44 free runs at a predetermined rate, for example, 100 kilohertz. The history controller 38 and memory counter 40 cyclically address every sector and storage location in the waveform memory 36, reading out the stored waveform data. The stored waveform data is converted to analog form by digital-to-analog converter 70 to provide a vertical waveform signal which is applied via switch 74 to the vertical amplifier 12. At the same time, the count signal from memory counter 40 is converted by digital-to-analog converter 72 to a sweep sawtooth signal which is applied via switch 76 to horizontal amplifier 16. Thus the waveforms are displayed in rapid succession. Such waveforms may be viewed simultaneously provided they occur at a rate which exceeds the critical fusion frequency of the human eye, that frequency at which a repetitive display becomes flicker free.

During the time that stored waveforms are being read out and displayed, counter 50 remains at the count last established by pressing switch 62 so that subsequent recording of waveforms will resume with the next sector in the recording sequence.

It will, therefore, be appreciated that the aforementioned and other desirable objects have been achieved; however, it should be noted that the particular embodiment of the invention, which is shown and described herein, is intended as merely illustrative and not as restrictive of the invention. For example, it would be within the purview of one having ordinary skill in the art to provide additional circuitry to selectively recall any desired waveform for display, such as, for example, by providing an additional counter or control circuit within the history controller 38.

What I claim as novel is:

1. A multiple waveform storage system, comprising:
   a memory having $2^p$ sectors, each sector having $2^m$ addressable storage locations, for sequentially storing digital data representing a plurality of analog signals;
   history control means for selecting sectors of said memory sequentially upon command in a storage mode such that digital data to be stored replaces the oldest data, and for selecting sectors of said memory cyclically in a readout mode; and
   means for sequentially addressing said storage locations within a sector selected by said history control means.

2. A multiple waveform storage system in accordance with claim 1 wherein said means for sequentially addressing said storage locations comprises a clock-signal generator, and memory counter means responsive to said clock signals for providing a count output to sequentially address each of said $2^m$ storage locations.

3. A multiple waveform storage system in accordance with claim 2 wherein said history control means comprises a first history counter, a second history counter, and means for selecting a history control output from one of said first and second history counters, said first history counter being advanced one count upon command, and said second history counter being advanced one count in response to a completion of a count cycle by said memory counter means.

4. A multiple waveform storage system in accordance with claim 3 wherein said memory counter means comprises a resettable binary counter having m count output lines and an overflow output, and wherein said first and second history counters each comprise a binary counter having p count output lines.

* * * * *